United States Patent [19]

Masuda

[11] Patent Number: 4,617,481
[45] Date of Patent: Oct. 14, 1986

[54] AMPLIFIER CIRCUIT FREE FROM LEAKAGE BETWEEN INPUT AND OUTPUT PORTS

[75] Inventor: Shinji Masuda, Tokyo, Japan

[73] Assignee: NEC Corporation, Tokyo, Japan

[21] Appl. No.: 545,692

[22] Filed: Oct. 26, 1983

[30] Foreign Application Priority Data

Oct. 29, 1982 [JP] Japan ................................ 57-190201

[51] Int. Cl.⁴ .......................... G06G 7/10; H03F 1/02; H03B 1/00
[52] U.S. Cl. .................................... 307/491; 328/127; 328/162; 330/9
[58] Field of Search ................. 328/127, 162; 307/491, 307/493, 352, 353, 542, 562, 546, 567, 555, 568; 330/9, 107; 333/173, 213

[56] References Cited

U.S. PATENT DOCUMENTS 4,186,700 2/1980 Stoian ................................... 328/127
4,306,196 12/1981 Dwarakanath et al. ................ 330/9
4,393,351 7/1983 Gregorian et al. .................. 328/127
4,404,525 9/1983 Amir et al. ............................... 330/9
4,410,855 10/1983 Underhill et al. .................... 307/353
4,439,693 3/1984 Lucas et al. ........................... 333/173

OTHER PUBLICATIONS

McCharles, et al, "An Algorithmic Analog-to-Digital Converter" *IEEE Int'l Solid-State Circuits Conf. Digest of Tech. Papers,* 1977, pp. 96–97.

Primary Examiner—Stanley D. Miller
Assistant Examiner—Timothy P. Callahan
Attorney, Agent, or Firm—Burns, Doane, Swecker & Mathis

[57] ABSTRACT

A leakage current between the inverting input terminal and the output terminal of an operational amplifier having a switch between the two terminals is prevented from flowing by equalizing the potentials at the two terminals of the switch when it is open. This is accomplished by dividing the switch into two and inserting an additional switch between the intermediate node of the divided two switches and a reference potential point.

9 Claims, 3 Drawing Figures

U.S. Patent     Oct. 14, 1986     4,617,481
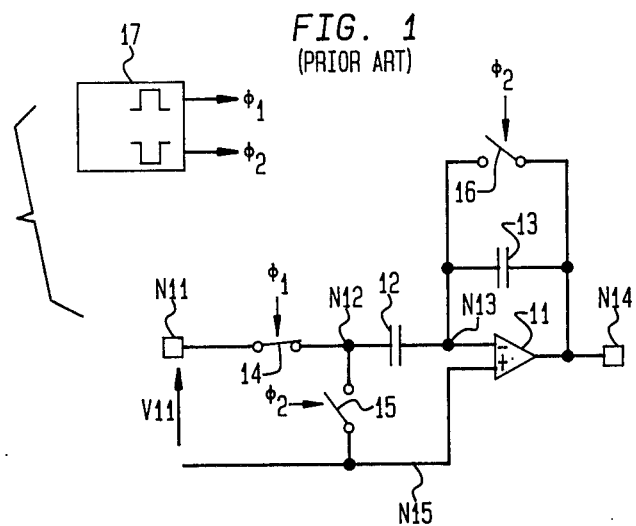
FIG. 1
(PRIOR ART)
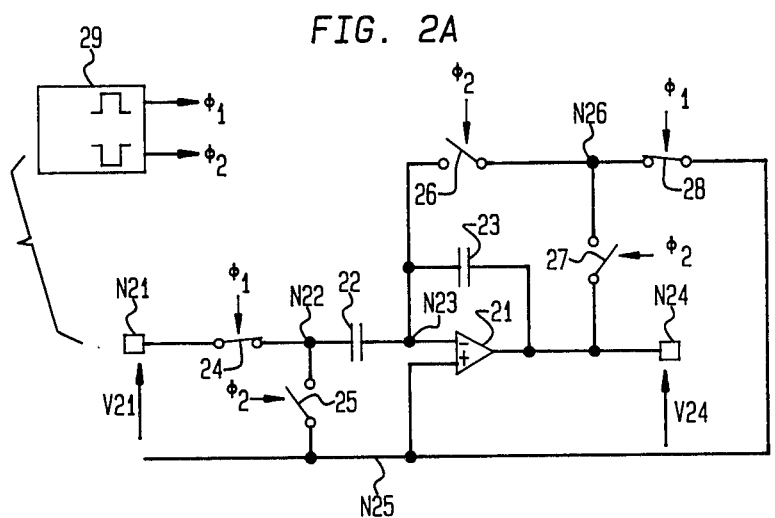
FIG. 2A
FIG. 2B
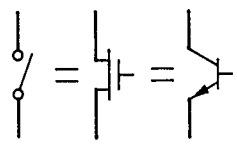

AMPLIFIER CIRCUIT FREE FROM LEAKAGE BETWEEN INPUT AND OUTPUT PORTS

BACKGROUND OF THE INVENTION

The present invention relates to a circuit producing an output signal free from a leakage between output and inputs ends, and more particularly to a coefficient multiplying circuit which multiplies an input signal by a predetermined coefficient defined by the capacitance ratio of capacitors.

A conventional circuit multiplying an input signal by a predetermined coefficient consists of an input terminal, a first capacitor connected to the input terminal through a first switch, a second capacitor connected in series with the first capacitor, an operational amplifier having an inverting input port and an output port which are connected to the terminals of the second capacitor, respectively, and a non-inverting input port which is connected to a point of a reference voltage or a power supply voltage, an output terminal connected to the output port of the operational amplifier, a second switch connected in parallel with the second capacitor, and a third switch connected between the point of a reference voltage or a power supply voltage and the electrode on the input terminal side of the first capacitor. The first, second and third switches are usually transistors able to operate at high speed. In particular, MOS field effect transistors are most favorable because of their high resistances when nonconductive.

Even MOS field effect transistors, however, do not have an infinite resistance when nonconductive. Therefore, the electric charges stored in the first and second capacitors discharge through the switches. In other words, the output obtained deviates from the value to be produced by multiplying the input voltage by the capacitance ratio of the first and second capacitors, so that a correct output is not obtained.

SUMMARY OF THE INVENTION

The object of the present invention is to provide a circuit producing an output signal free from the leakage of charges between an output and input ports.

Another object of the present invention is to provide a coefficient multiplying circuit which does not generate leakage currents through the switches between an output and input ports when the switches are turned off.

The circuit according to the present invention comprises an operational amplifier and a first analog switch coupled between the inverting input terminal of the operational amplifier and the output terminal of the operational amplifier, the non-inverting input terminal of the operational amplifier is connected to the ground or a reference potential terminal and is characterized by further comprising a second analog switch inserted between the first analog switch and the output terminal of the operational amplifier and a third analog switch coupled between the non-inverting input terminal of the operational amplifier and the connection point of the first and second analog switches.

According to the circuit of the present invention, one terminal of the first analog switch is connected to the inverting input port of the operational amplifier. The inverting input port is nearly at the ground or reference potential, when the operational amplifier is balanced, because the non-inverting input port is connected to the ground or the reference potential terminal. The other terminal of the first analog switch is connected, when it is OFF state, to the ground or the reference potential terminal through the third analog switch. The third analog switch is turned on when the first analog switch is turned off, while the second analog switch operates together with the first analog switch. Since the both terminals of the first analog switch are maintained at the same ground or reference potential when the first analog switch is turned off, substantially no potential difference exists across the both terminals and any leakage current does not flow through the first analog switch.

In one aspect of the present invention, the circuit comprises:

an input terminal receiving an input signal;

a reference potential terminal provided with a reference potential;

a first switch having a first terminal connected to the input terminal, and a second terminal;

a capacitor having a first terminal connected to the second terminal of the first switch, and a second terminal;

a second switch connected between the second terminal of the first switch and the reference potential terminal;

an operational amplifier having an inverting input port connected to the second terminal of the first capacitor element, a non-inverting input port connected to the reference potential terminal, and an output port;

a third switch having a first terminal connected to the inverting input port of the operational amplifier, and a second terminal;

a fourth switch connected between the second terminal of the third switch and the output port of the operational amplifier;

a fifth switch connected between the second terminal of the third switch and the reference potential terminal; and means for driving the first, second, third, fourth, and fifth switches, the switch drive means making the first and fifth switches assume a first on/off condition simultaneously, and the second, third, and fourth switches assume a second on/off condition simultaneously, so that the first and fifth switches are not in the same on/off condition at the same time as the second, third, and fourth switches.

Another aspect of the present invention further comprises an additional capacitor connected between the inverting input port and the output port of the operational amplifier and provides a coefficient multiplying circuit. The additional capacitor is discharged through the third and fourth switches connected between the inverting input port and the output port of the operational amplifier. When the third and fourth switches are turned off, the electric charges stored in the additional capacitor are not discharged through the third switch whose first and second terminals are maintained at the same potential. Accordingly, the output of the coefficient multiplying circuit is exactly determined by the capacitance ratio of the first and second capacitors.

BRIEF DESCRIPTION OF THE DRAWINGS

The above and further objects, features and advantages of the present invention will become more apparent from the following detailed description taken in conjunction with the accompanying drawings, wherein:

FIG. 1 is a diagram of a conventional coefficient multiplying circuit;

FIG. 2(a) is a diagram of a coefficient multiplying circuit according to an embodiment of the present invention; and FIG. 2(b) is a diagram of examples of switches employed in the circuit of FIG. 2(a).

DETAILED DESCRIPTION OF THE INVENTION

FIG. 1 shows a conventional coefficient multiplying circuit in which an input signal of voltage $V_{11}$ is applied between a reference potential line $N_{15}$ and an input terminal $N_{11}$. The input terminal $N_{11}$ is connected to a first capacitor 12 through a first switch 14. A connection node $N_{12}$ between the first switch 14 and the first capacitor 12 is connected with a second switch 15 which is connected to the reference potential line $N_{15}$. The reference potential line $N_{15}$ is maintained, for example, at ground potential. The first capacitor 12 has a capacitance $C_{12}$ and is connected to the inverting input port "−" of an operational amplifier 11 at a connection node $N_{13}$. The non-inverting input port "+" of the operational amplifier 11 is connected to the reference potential line $N_{15}$, and its output port is connected to an output terminal $N_{14}$. A second capacitor 13 having a capacitance $C_{13}$ and a third switch 16 are connected in parallel between the inverting input port "−" and the output port of the operational amplifier 11. The first, second and third switches 14, 15, and 16 are, for example, between source and drain electrodes of MOS field effect transistors which change their conductivities between source and drain electrodes in response to voltages of pulses $\phi_1$, $\phi_2$ generated by a switch drive circuit 17 and applied to their gate electrodes. The switches 14, 15, and 16 are actuated by the switch drive circuit 17 in such a manner that the second and third switches 15, 16 are open when the first switch 14 is closed, and vice versa. Namely, the switches 14 and 15 and the switch 16 are opened and closed alternately.

On the first phase of the operation, the first switch 14 is opened and the second and third switches 15 and 16 are closed to initialize the circuit. The node $N_{13}$ and the output terminal $N_{14}$ are made at the same potential to discharge electric charges stored in the second capacitor 13. The node $N_{12}$ is at the same potential as the line $N_{15}$ by the operation of the amplifier 11 and the node $N_{11}$ is made connected to the line $N_{15}$. Therefore, the first capacitor 12 is also discharged. On the second phase, the first switch 14 is closed and the second and third switches 15 and 16 are opened. The input signal is applied to the capacitor 12 and electric charges of a quantity of $V_{11} \cdot C_{12}$ are charged into the first capacitor 12. To neutralize the electric charges of the first capacitor 12, electric charges of the same quantity are charged into the second capacitor 13 from the output terminal $N_{14}$ or from the power supply terminal (not shown) through the operational amplifier 11. The second capacitor 13 has a capacitance $C_{13}$ and, hence, the voltage between its terminals is given by $$\left( -V_{11} \cdot \frac{C_{12}}{C_{13}} \right) ;$$

i.e., a voltage of $$\left( -V_{11} \cdot \frac{C_{12}}{C_{13}} \right)$$

is obtained at the output terminal $N_{14}$ as an output signal. Thereafter, the first phase and the second phase are repeated alternately, so that the input signal is sampled at a predetermined rate, and voltages obtained by multiplying the sampled voltage by the capacitance ratio $C_{12}/C_{13}$ of the first and second capacitors 12 and 13 are produced at the output terminal $N_{14}$ in succession.

The switches 14, 15 and 16 have finite resistances such as 10 gigaohms even when they are under open conditions. Therefore, electric charges inevitably leak through these finite resistances. The output voltage of the coefficient circuit is determined by the quantity of electric charges stored in the second capacitor 13. Therefore, if the electric charges leak through the third switch 16 during the second phase, the value of the output voltage is deviated from the true value. Assumed that the third switch 16 under the open condition has a resistance of 10 gigaohms and the first capacitor 12 has a capacitance $C_{12}$ of 1 pF which the input signal has a voltage $V_{11}$ of 5 volts and pulses $\phi_1$, $\phi_2$ driving the switches 14, 15 and 16 have a frequency of 1 KHz, an error of about 0.5 volt is generated in the output voltage at the output terminal $N_{14}$.

Referring to FIGS. 2(a) and 2(b), an embodiment of the present invention will be described. In this embodiment, the input portion is similar to the prior art circuit of FIG. 1. An input terminal $N_{21}$ receiving an input signal of a voltage $V_{21}$ is connected to a connection node $N_{22}$ through a first switch 24. A second switch 25 is connected between the connection node $N_{22}$ and a reference potential line $N_{25}$. Although the reference potential line $N_{25}$ is preferably maintained at ground potential, it may be kept at another fixed potential such as several volts or power supply voltage. The connection node $N_{22}$ is further connected to a connection node $N_{23}$ through a first capacitor 22 which has a capacitance $C_{22}$ of, for example, 1 pF. The inverting input port "−" of an operational amplifier 21 is connected to the connection node $N_{23}$, its non-inverting input port "+" is connected to the reference potential line $N_{25}$, and its output port is connected to an output terminal $N_{24}$. A second capacitor 23 of a capacitance $C_{23}$ of, for example, 10 pF is connected between the output port of the operational amplifier 21 and the connection node $N_{23}$. One terminal of a third switch 26 is connected to the node $N_{23}$. According to this embodiment, a fourth switch 27 is connected between the other terminal $N_{26}$ of the third switch 26 and the output terminal $N_{24}$ and a fifth switch 28 is connected between the node $N_{26}$ and the reference potential line $N_{25}$. An output signal of a voltage $V_{24}$ is obtained at the output terminal $N_{24}$.

The first, second, third, fourth, and fifth switches 24, 25, 26, 27, and 28 are MOS field effect transistor or bipolar transistors, as shown in FIG. 2(b). The switches 24, 25, 26, 27 and 28 are opened and closed in response to the voltages applied to the control electrodes (gate or base electrodes) thereof. These voltages are applied from a switch drive circuit 29 as the drive pulses $\phi_1$ and $\phi_2$. The drive pulses $\phi_1$ and $\phi_2$ have two levels: a high level of, for instance, +2.5 volts and a low level of, for instance, −2.5 volts, and have phases opposite to each other. Their frequency is, for example, 1 KHz. The drive pulse $\phi_1$ is supplied to the first switch 24 and the fifth switch 28 to open and close them simultaneously. The drive pulse $\phi_2$ is supplied to the second, third, and fourth switches 25, 26, 27 to open and close them simultaneously.

The operation of the circuit will be described below. On the first phase of the operation, the first and fifth switches 24, 28 are opened, and the second, third, and fourth switches 25, 26, 27 are closed. As a result, the connection nodes $N_{22}$, $N_{23}$ and $N_{26}$ and the output terminal $N_{24}$ reach the same reference potential, and the electric charges in the first and second capacitors 22, 23 are discharged. The whole circuit is initialized by this first phase for the following second phase.

Then the first and fifth switches 24 and 28 are closed, and the second, third, and fourth switches 25, 26, and 27 opened, so that electric charges of $C_{22} \cdot V_{21}$ are charged into the first capacitor 22 by the voltage $V_{21}$ of the input signal. To neutralize these electric charges, electric charges of the same quantity as $C_{22} \cdot V_{21}$ are charged into the second capacitor 23 from the output terminal $N_{24}$, or from the output port of the operational amplifier. Therefore, a voltage $V_{24}$ is obtained by dividing the electric charges by the capacitance $C_{23}$ of the second capacitor 23 across the capacitor 23 and derived from the output terminal $N_{24}$. This state is referred to as the second phase. The first phase and the second phase are repeated, so that the input signal is sampled at the repetition frequency of the drive pulses $\phi_1$ and $\phi_2$ and output voltages obtained by multiplying the sampled values by the capacitance ratio $C_{22}/C_{23}$ of the first and second capacitors 22, 23 are produced in succession.

In the second phase, the connection node $N_{23}$ is connected to the inverting input port "−" of the operational amplifier 21 which is at a potential equal to that of the non-inverting input port "+" when the amplifier 21 is balanced. Therefore, the potential at the node $N_{23}$ is equal to the potential at the reference potential line $N_{25}$. The connection node $N_{26}$, on the other hand, is connected directly to the reference potential line $N_{25}$ by the closed fifth switch 28. Therefore, the connection node $N_{26}$ also reaches a potential at the reference potential line $N_{25}$. Thus, both terminals of the third switch 26 are a potential equal to that of the reference potential line 25. Therefore, the electric charges stored in the second capacitor 23 do not leak through the third switch 26. Accordingly, the voltage $V_{24}$ obtained at the output terminal $N_{24}$ has the correct value of $$\left( -V_{21} \cdot \frac{C_{22}}{C_{23}} \right).$$

The coefficient multiplying circuit shown in FIG. 2(a) is preferably formed as a monolithic integrated circuit on a single semiconductor chip. The switches 24, 25, 26, 27, and 28 may be either MOS field effect transistors or bipolar transistors, as shown in FIG. 2(b). MOS field effect transistors are preferable because of their large resistances between source and drain electrodes when non-conductive. The operational amplifier 21 may be made up of either MOS field effect transistors or bipolar transistors. Where the switches are composed of MOS field effect transistors, the operational amplifier 21 should also be made up of MOS field effect transistors and, favorably, be made up of complementary MOS field effect transistors. On a monolithic integrated circuit, a capacitor is able to have a capacitance of about 100 pF at the greatest. Therefore, the capacities $C_{22}$, $C_{23}$ of the first and second capacitors 22, 23 are selected to be within this range. The ratio $C_{22}/C_{23}$ of the capacitances can be selected as required.

In the above embodiment, the present invention is applied to the coefficient multiplying circuit. However, the principal of the present invention may be applied to other circuits. For example, the invention may be applied to a comparator comparing the sampled input signal with the reference voltage, in which the second capacitor 23 in FIG. 2(a) is omitted. According to this comparator, on the first phase, the switches 24 and 28 are opened and the switches 25, 26 and 27 are closed to discharge the charges in the capacitor 22 for the initialization of the circuit. On the second phase, the switches 24 and 28 are closed and the switches 25, 26 and 27 are opened to receive the input signal for comparason. The potentials at the connection nodes $N_{23}$ and $N_{26}$ has the same value, as explained above. Therefore, any leakage from the output terminal 24 to the connection node $N_{23}$ does not occur. The obtained output signal does not involve any offset voltage based on the leakage and shows an exact voltage. Similarly, the invention may be applied to a circuit employing the operational amplifier whose inverting input port and output port are required to be operatively connected by an analog switch.

What is claimed is:

1. A circuit comprising:
   an input terminal receiving an input signal;
   a reference potential terminal;
   an output terminal for receiving an output signal;
   an operational amplifier having an inverting input port connected to said input termihal, a non-inverting input port connected to said reference potential terminal, and an output port connected to said output terminal;
   a first switch connected between said inverting input port and a first connection node;
   a second switch connected between said first connection node and said output terminal;
   a third switch connected between said first connection node and said reference potential terminal; and
   a means for controlling said first, second, and third switches, said switch controlling means operatively closing said first and second switches simultaneously and operatively closing said third switch when said first and second switches are opened so that the potential difference between said first connection node and said inverting input port is reduced when said first and second switches are open to prevent leakage current from flowing between said inverting input port and said output port of said operational amplifier.

2. A circuit as claimed in claim 1, further comprising a fourth switch having between said input terminal and a second connection node, a first capacitor inserted between said second connection node and said inverting input port of said amplifier, and a fifth switch inserted between said reference potential terminal and said second connection node, said fourth switch being controlled to be closed together with said third switch, and said fifth switch being controlled to be closed and opened together with said first and second switches.

3. A circuit as claimed in claim 2, wherein said first, second, third, fourth and fifth switches are made of field effect transistors.

4. A circuit as claimed in claim 2, further comprising a second capacitor inserted between said inverting input port and said output port of said amplifier.

5. A circuit as claimed in claim 4, wherein said first, second, third, fourth and fifth switches are made of field effect transistors.

6. A circuit comprising:
an input terminal receiving an input signal;
a reference potential terminal;
an output terminal for receiving an output signal;
a first switch connected between said input terminal and a first connection node;
a second switch connected between said first connection node and said reference potential terminal;
a first capacitor connected between said first connection node and a second connection node;
an amplifier having an inverting input port connected to said second connection node, an non-inverting input port connected to said reference potential terminal, and an output port connected to said output terminal;
a third switch connected between said second connection node and a third connection node;
a fourth switch connected between said third connection node and said output port;
a fifth switch connected between said third connection node and said reference potential terminal; and
a means for controlling said first, second, third, fourth, and fifth switches, said switch controlling means alternately generating a first phase in which said first switch and said fifth switch are opened and said second switch, said third switch, and said fourth switch are closed, and a second phase in which said first switch and said fifth switch are closed and said second switch, said third switch, and said fourth switch are opened.

7. The circuit according to claim 6, further comprising a second capacitor connected between said second connection node and said output port.

8. A coefficient multiplying circuit comprising:
an input terminal receiving an input signal;
a reference potential terminal;
an amplifier having an inverting input port, a non-inverting input port connected to said reference potential terminal, and an output port;
a first capacitor having one end connected to said inverting input port;
a first means coupled between said input terminal and the other end of said capacitor for charging said first capacitor in accordance with said input signal;
a second capacitor coupled between said inverting input port and said output port;
first and second switches connected in series between said inverting input port and said output port;
a third switch coupled between the connection node of said first and second switches and said reference potential terminal; and
a second means for controlling said first and second switches simultaneously and said third switch in an opposite mode, so that the potential difference between said first connection node and said inverting input port is reduced when said first and second switches are open to prevent leakage current from flowing between said inverting input port and said output port of said operational amplifier.

9. A coefficient multiplying circuit according to claim 8, wherein said first means includes a fourth switch connected between said input terminal and the other end of said first capacitor.

* * * * *